United States Patent [19]

Oppelt et al.

[11] Patent Number: 4,801,884

[45] Date of Patent: Jan. 31, 1989

[54] APPARATUS FOR THE IDENTIFICATION OF NUCLEAR MAGNETIC SPECTRA FROM SPATIALLY SELECTABLE REGIONS OF AN EXAMINATION SUBJECT

[75] Inventors: Arnulf Oppelt, Spardorf; Uwe Klose, Braunschweig; Ralf Ladebeck, Erlangen; Dietmar Hentschel, Niederndorf, all of Fed. Rep. of Germany

[73] Assignee: Siemens Aktiengesellschaft, Berlin & Munich, Fed. Rep. of Germany

[21] Appl. No.: 151,256

[22] Filed: Feb. 1, 1988

[30] Foreign Application Priority Data

Jan. 30, 1987 [DE] Fed. Rep. of Germany ....... 3702820

[51] Int. Cl.[4] .............................................. G01R 33/20
[52] U.S. Cl. .................................... 324/309; 128/653
[58] Field of Search .................... 324/302, 309, 312; 128/653

[56] References Cited

U.S. PATENT DOCUMENTS 4,563,647 1/1986 Young .................................. 324/309
4,712,066 12/1987 Luyten et al. ...................... 324/309
4,733,185 3/1988 Bottomley ......................... 324/309

FOREIGN PATENT DOCUMENTS 0106226 4/1984 European Pat. Off. .
0153703 9/1985 European Pat. Off. .
WO85/00887 2/1985 PCT Int'l Appl. .

OTHER PUBLICATIONS

Frahm et al., "Localized Proton Spectroscopy ... ", J. of Magnetic Resonance, vol. 72, pp. 502–508, 1987.
"Selected Volume Excitation Using Stimulated Echoes (VEST), Applications to Spatially Localized Spectroscopy and Imaging," Granot, J. Mag. Res. 70, (1986), pp. 488–492.
"Solvent-Suppressed Spatially Resolved Spectroscopy. An Approach to High-Resolution NMR on a Whole-Body MR System," Luyten et al., J. Mag Res. 67, (1986), pp. 148–155.
"Depth-Resolved Surface-Coil Spectroscopy (Dress) for in Vivo $^1$H, $^{31}$P, and $^{13}$C NMR," Bottomley et al., J. Mag. Res. 59, (1984), pp. 338–342

Primary Examiner—Stewart J. Levy
Assistant Examiner—Kevin D. O'Shea
Attorney, Agent, or Firm—Hill, Van Santen, Steadman & Simpson

[57] ABSTRACT

An apparatus for identifying nuclear magnetic spectra from spatially selectable regions of an examination subject supplies pulse signals to the examination subject in the following sequence. A first, non-selective 90° RF pulse is supplied to the patient so that the magnetization of the examination subject is oriented out of the z-direction into an x-y plane perpendicular thereto. A first, selective 180° RF pulse is then supplied simultaneously with a first magnetic gradient $G_z$ which effects a dephasing of the spins outside of a first, selected slice $S_1$. A second, selective 180° RF pulse is then supplied simultaneously with a second magnetic gradient $G_x$ disposed perpendicularly to the first magnetic gradient. The second magnetic gradient effects a dephasing of the spins outside of a second selected slice $S_2$. A second, selective 90° RF pulse is then supplied simultaneously with a third magnetic gradient $G_y$, which is disposed perpendicularly relative to the first and second magnetic gradients. A third 90° RF pulse is then supplied, and the signal emitted by the examination subject in response thereto is evaluated.

4 Claims, 2 Drawing Sheets

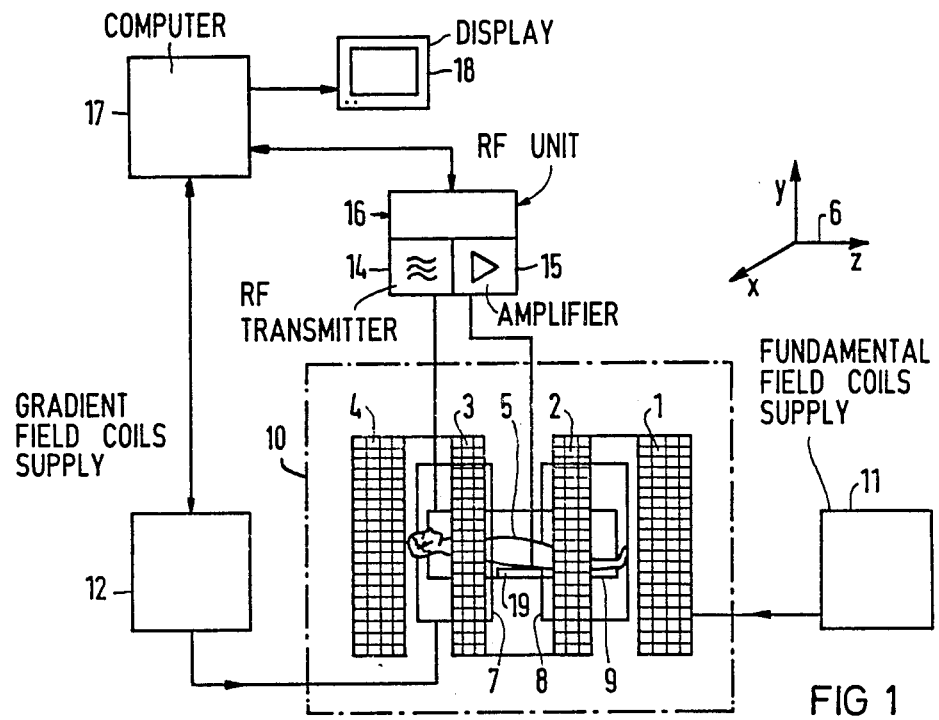
FIG 1
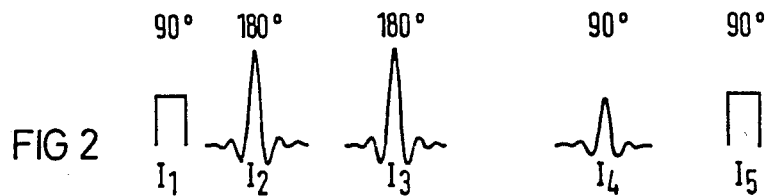
FIG 2
FIG 3
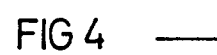
FIG 4
FIG 5
FIG 6
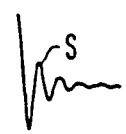

APPARATUS FOR THE IDENTIFICATION OF NUCLEAR MAGNETIC SPECTRA FROM SPATIALLY SELECTABLE REGIONS OF AN EXAMINATION SUBJECT

BACKGROUND OF THE INVENTION

1. Field of the Invention

The present invention is directed to nuclear magnetic resonance devices, and methods for operating such devices, for identifying nuclear magnetic spectra from spatially selectable regions of an examination subject.

2. Description of the Prior Art

Nuclear magnetic resonance devices are generally known in which an examination subject is placed within a fundamental field, generated by fundamental field coils, and in one or more gradient fields respectively generated by gradient coils. An RF transmitter supplies a sequence of RF pulses to the patient via an antenna, and an RF receiver receives the resulting nuclear magnetic resonances signals from the patient, and supplies these signals to a computer for evaluation. A slice of the examination subject can thereby be selectively excited to generate nuclear magnetic resonance signals by applying a gradient field together with a frequency-selective RF pulse. In nuclear magnetic spectroscopy, limitation of the examination to selected volume regions, for example, a particular organ, is generally desired. In a known method described in the article "Depth-Resolved Surface-Coil Spectroscopy (DRESS) For In Vivo $^1$H, $^{31}$P, and $^{13}$C NMR," Bottomley et al, Journal of Magnetic Resonance, Vol. 59 (1984) pages 338–342, a slice of the examination subject is excited for this purpose by applying a gradient field together with a frequency-selective excitation pulse. Only a one-dimensional topical resolution is possible using this method. A further selection can be undertaken by using surface coils which again select a portion of the first-selected slice in accord with their sensitivity range.

SUMMARY OF THE INVENTION

It is an object of the present invention to provide a method for operating a nuclear magnetic resonance device which permits a more exact topical resolution of the examination subject than has been heretofore possible.

It is a further object of the present invention to achieve such exact topical resolution with the RF load on the examination subject being as low as possible.

The above objects are achieved in a method for operating a nuclear magnetic resonance apparatus wherein the following excitation and read-out steps are undertaken by successive activation of an RF transmitter and gradient coils. The magnetization of the examination subject is first rotated out of the z-direction, established by the fundamental magnetic field, into an x-y plane disposed perpendicularly thereto by the application of a first, non-selective 90° RF pulse. This is followed by a first, selective 180° RF pulse which is applied to the patient simultaneously with a first magnetic gradient. The first magnetic gradient effects a dephasing of the spin outside of a first selected slice. A second, selective 180° RF pulse is then supplied simultaneously with a second magnetic gradient, which is disposed perpendicularly relative to the first magnetic gradient. The second magnetic gradient effects a dephasing of the spin outside of a second selected slice. A second, selective 90° RF pulse is then supplied simultaneously with a third magnetic gradient, which is disposed perpendicularly relative to the first and second magnetic gradients. The third magnetic gradient brings the spin in a selected volume (voxel) back into parallel with the initial position. A third 90° RF pulse is then applied to the examination subject, and the signal emitted by the examination subject in response thereto is evaluated.

A complete, three-dimensional topical resolution is possible using the above method, with the RF load on the examination subject remaining low because only two selective 180° RF pulses and three 90° RF pulses are needed.

DESCRIPTION OF THE DRAWINGS

FIG. 1 is a schematic block diagram of a nuclear magnetic resonance apparatus operable in accordance with the principles of the present invention.

FIG. 2 shows the sequence of the RF pulses which are supplied to the examination subject in accordance with the principles of the present invention.

FIGS. 3, 4 and 5 respectively show the curves for the gradients $G_z$, $G_y$ and $G_x$ in accordance with the principles of the present invention.

FIG. 6 shows the curve of the signal S which is read out from the examination subject.

DESCRIPTION OF THE PREFERRED EMBODIMENTS

Figure 7:
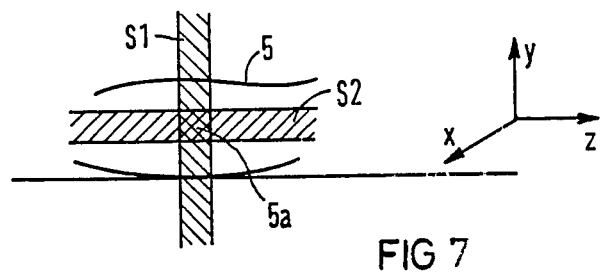
FIG. 7 schematically shows the selection of the individual slices within the examination subject in accordance with the principles of the present invention.

A nuclear magnetic resonance apparatus operable in accordance with the principles of the present invention is schematically shown in FIG. 1. The apparatus is used for identifying the spectra of an examination subject. For medical uses, the examination subject will be a patient 5. The apparatus includes fundamental coils 1, 2, 3 and 4 for generating a fundamental magnetic field in which the patient 5 is disposed. Three sets of gradient coils are also provided for generating independent orthogonal gradient fields in the x, y and z directions, in accordance with the coordinate system 6 shown in the drawing. For clarity, only the gradient coils 7 and 8 are shown in FIG. 1, these coils generating a gradient field in the x-direction in combination with another pair of identical gradient coils (not shown) disposed on the opposite side of the patient 5. Other sets of gradient coils (not shown) generate gradient fields in the y-direction and are disposed parallel to the patient 5 above and below the patient 5, and for generating a gradient field in the z-direction disposed transversely to the longitudinal axis of the patient 5 at the head and feet of the patient 5.

The apparatus also includes a body resonator 9 functioning as an antenna for generating the nuclear magnetic resonance signals. A surface coil 19 may be provided for detecting the nuclear magnetic resonance signals.

The aforementioned components, shown bounded by the dot( dash line 10 in FIG. 1, constitute the actual examination instrument. These components are operted by external elements, including a power supply 11 for the fundamental field coils, and a power supply 12 for the gradient field coils. An transmitter 14, controlled by a process computer 17, is connected to the body resonantor 9. The surface coil 19 is also coupled to the process computer 17 via a signal amplifier 18. The output of the computer 17 is supplied to a display 18 for visually representing a spectrum from the patient 5. The amplifier 15 and the RF transmitter 14 are part of an RF unit 16 for signal generating and registration.

The excitation sequence shall be discussed below with reference to FIGS. 2–6. The magnetization in the examination region of the patient 5 initially is in the z-direction, due to the fundamental magnetic field. As a result of a non-selective 90° RF pulse $I_1$ shown in FIG. 2, the magnetization of the entire examination volume is rotated into the x-y plane. A selective 180° RF pulse $I_2$, having a selected frequency, is then supplied simultaneously with a gradient $G_z$. As a result of the gradient $G_z$ and the selected frequency of the 180° RF pulse $I_2$, a slice (referenced $S_1$ in FIG. 7) is selected, the selective 180° RF pulse being effective only in this slice, and rotating all spins in that slice by 180°. Outside of the slice $S_1$, the spins are dephased due to the gradient $G_z$, because they exhibit a different precessional frequency.

A second, selective 180° RF pulse $I_3$ is then applied simultaneously with a gradient $G_x$. The gradient $G_x$ acts selectively in a slice $S_2$, disposed perpendicularly relative to the first slice $S_1$. Due to the gradient $G_x$, all spins outside of the slice $S_2$ are dephased. Only the pins in a cube which is formed by the intersection of the two slices $S_1$ and $S_2$ remain in phase.

Finally, a second, selective 90° RF pulse $I_4$ is supplied simultaneously with a gradient $G_y$. The spins in a third layer (not shown in FIG. 7), which is disposed perpendicularly to the layers $S_1$ and $S_2$, are thus rotated by 90°. The spins disposed in a voxel, which is determined by the intersection of the three slices, are thus rotated relative to the Z-axis. When the first, non-selective 90° RF pulse Il and the selective 90° RF pulse $I_4$ have the same operational sign, the spins in this voxel will be in the −z-direction. When the 90° RF pulses have opposite operational signs, the spins will be in the +z-direction.

An undesired dephasing of the spins occurs due to the gradient $G_y$ applied during the selective 90° RF pulse. dephasing can be compensated by a previously applied gradient pulse $G_y'$, having an operational sign opposite to that of the gradient pulse $G_y$. Compensation can also be undertaken before the selective 180° RF pulses $I_2$ or $I_3$, although it must be remembered that every 180° RF pulse inverts the effect. A negative gradient pulse $G_y'$ would therefore have to be applied before the first 180° RF pulse $I_2$, and a positive gradient pulse $G_y'$ would have to be applied before the second 180° RF pulse $I_3$.

The sequence of the gradients described above is only by way of example, and the gradients in the respective directions can be applied in an arbitrary sequence.

After excitation in the sequence described above, only the spins of the selectied voxel will be in the z-direction. The examination volume is then supplied with a non-selective 90° RF pulse $I_5$, so that the RF signal S shown in FIG. 6, originating only in the selected voxel, is obtained as a response.

A slight time delay can be imposed between the selective RF pulse $I_4$ and the non-selective 90° RF pulse $I_5$, so that eddy currents caused by the application of the gradients have had time to decay before the signal evaluation.

If, due to inhomogeneities, the magnetization outside of the selected voxel has not been completely rotated into the x-y plane as a result of the first, non-selective 90° pulse $I_1$, or if a portion of the magnetization has already returned to the z-direction due to short $T_1$ relaxation times following the volume selection, the blurring of the topical selection resulting therefrom can be compensated by using two successive excitation sequences. For this purpose, the excitation sequence described above and shown in the drawings is executed twice, with the selective 90° RF pulse $I_4$ being supplied once in the x-direction and once in the −x-direction. As a result, the magnetization of the voxel has an opposite operational sign, whereas the residual magnetization outside of the voxel has the same operational sign. When the measured results obtained from the two excitation sequences are then subtracted, only the magnetization of the voxel is preserved.

Figure 8:
FIGS. 8, 9 and 10 show the spectrum of a phantom which is achieved in accordance with the principles of the present invention.
Figure 9:
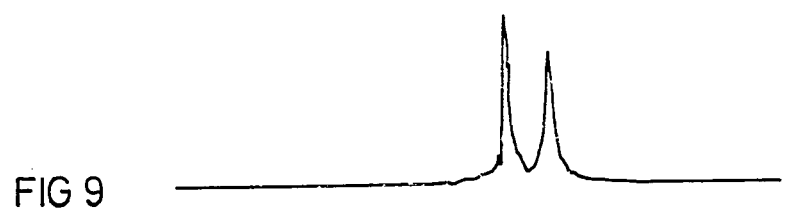
Figure 10:

FIGS. 8, 9 and 10 are spectra showing the result of the above excitation sequence using a phantom. The phantom consisted of a bottle filled with water, with a second bottle having oil therein being disposed inside of the first bottle. The spectrum shown in FIG. 8 was obtained when the voxel was exclusively localized in the water bottle. The spectrum of FIG. 9 was obtained when the voxel was localized in the boundary region of the oil bottle and the water bottle. The spectrum of FIG. 10 was obtained when the voxel was localized inside the oil bottle. The second peak in the spectrum results from residual water in the oil.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for operating a nuclear magnetic resonance examination apparatus including means for generating a fundamental magnetic field, which magnetizes an examination region within a patient, in a first direction, means for respectively generating independent orthogonal gradient fields in first, second and third directions, means for applying RF pulses to said patient, and means for acquiring nuclear magnetic resonance signals from said patient, said method comprising the steps of:

applying a first, non-selective 90° RF pulse to said patient which rotates the magnetization of said examination region out of said first direction into a plane defined by said second and third directions disposed perpendicularly relative to said first direction;

applying a first, selective 180° RF pulse to said patient simultaneously with a magnetic gradient in said first direction, said magnetic gradient in said first direction causing a dephasing of nuclear spins in said examination region outside of a first selected slice;

applying a second, selective 180° RF pulse to said patient simultaneously with a magnetic gradient in said second direction, said magnetic gradient in said second direction effecting a dephasing of the nuclear spins in said examination region outside of a second selected slice;

applying a second, selective 90° RF pulse to said patient simultaneously with a magnetic gradient in said third direction, said magnetic gradient in said third direction rotating said nuclear spins in said examination region in a selected volume of said examination region back into parallel with said first direction;

applying a third 90° RF pulse to said patient; and reading out nuclear magnetic resonances signals from said examination region in response to the application of said third 90° RF pulse for evaluation of said signals.

2. A method as claimed in claim 1 comprising the additional step of applying a gradient pulse in the same direction but having an opposite operational sign as said magnetic gradient in said third direction before applying said second, selective 90° RF pulse to compensate for dephasing produced by said magnetic gradient in said third direction.

3. A method as claimed in claim 1, wherein the step of applying said third 90° RF pulse is further defined by applying a 90° RF pulse after a selected time delay following said second, selective 90° RF pulse to permit eddy currents in said examination subject caused by said magnetic gradient in said third direction to decay.

4. A method as claimed in claim 1 comprising the additional steps of:

executing said method a first time to obtain a first data set from said nuclear magnetic resonances signals;

executing said method a second time with said second, selective 90° RF pulse having an opposite operational sign from the second, selective 90° RF pulse applied in the first execution of said method to generate a second data set from said nuclear magnetic resonance signals; and subtracting said first and second data sets.

* * * * *